United States Patent
Beebe et al.

(10) Patent No.: US 6,821,898 B2
(45) Date of Patent: Nov. 23, 2004

(54) METHOD OF FORMING A MULTI-LAYER MICROFLUIDIC DEVICE

(75) Inventors: David J. Beebe, Monona, WI (US); Glennys A. Mensing, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 157 days.

(21) Appl. No.: 09/952,243

(22) Filed: Sep. 14, 2001

(65) Prior Publication Data

US 2003/0054652 A1 Mar. 20, 2003

(51) Int. Cl.[7] ............................................. H01L 21/301
(52) U.S. Cl. ........................ 438/694; 438/700; 264/19
(58) Field of Search ............................... 438/694, 700; 137/833; 204/601; 422/52; 264/19, 463

(56) References Cited

U.S. PATENT DOCUMENTS

| | | | | |
|---|---|---|---|---|
| 5,443,890 A | * | 8/1995 | Ohman | ........................ 428/167 |
| 6,167,910 B1 | * | 1/2001 | Chow | ........................ 137/827 |
| 6,251,343 B1 | * | 6/2001 | Dubrow et al. | ............. 422/102 |
| 6,321,791 B1 | * | 11/2001 | Chow | ........................ 137/833 |
| 6,488,872 B1 | * | 12/2002 | Beebe et al. | .................. 264/31 |
| 6,494,230 B2 | * | 12/2002 | Chow | ........................ 137/827 |
| 2002/0134907 A1 | * | 9/2002 | Benett et al. | ............... 249/135 |

* cited by examiner

Primary Examiner—Kin-Chan Chen
(74) Attorney, Agent, or Firm—Boyle Fredrickson Newholm Stein & Gratz S.C.

(57) ABSTRACT

A method is provided for fabricating a multi-layer microfluidic device on a base. A first layer is positioned on the base in a spaced relationship thereto so as to define a construction cavity therebetween. The first layer has a passageway therethrough which communicates with the construction cavity. A mask is positioned between the construction cavity and an ultraviolet source. The mask corresponds to a channel to be formed in the construction cavity. The construction cavity is filled with material and a portion of the material is polymerized within the construction cavity so as to solidify the same. The solidified material defines the channel. Thereafter, the material is flushed from the channel in the construction cavity.

18 Claims, 8 Drawing Sheets

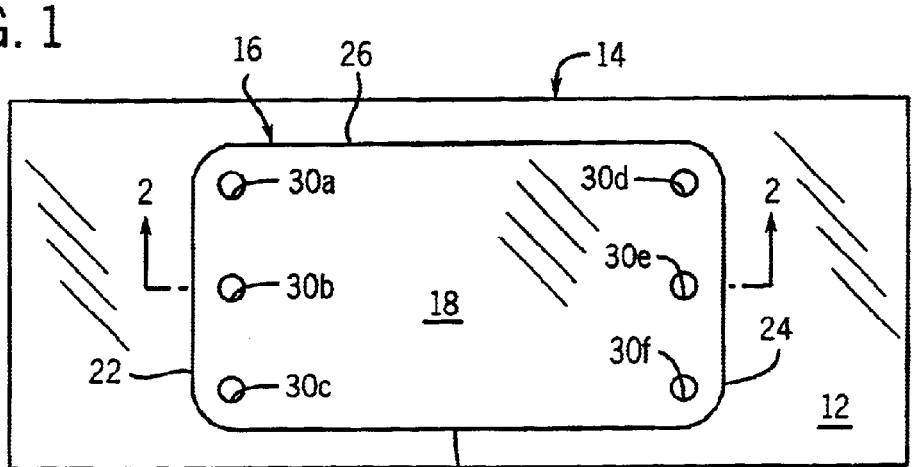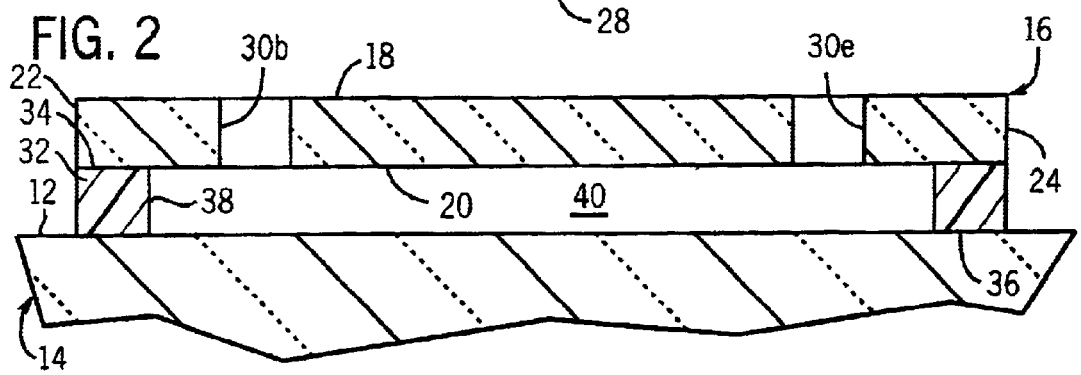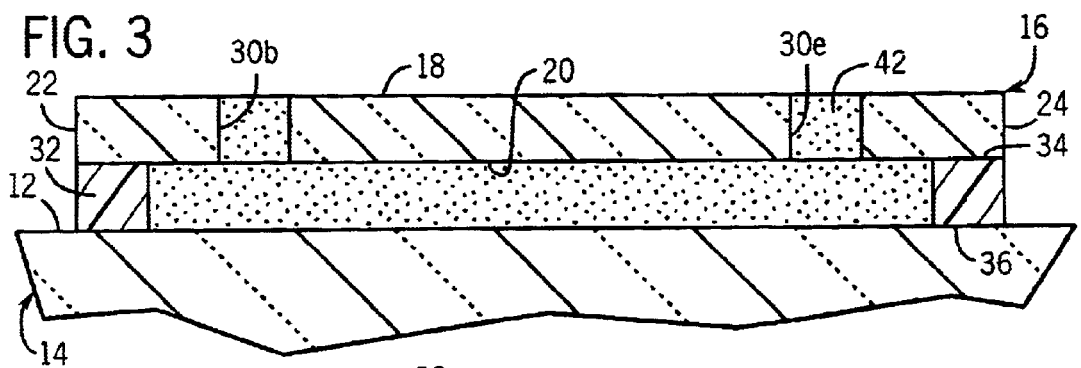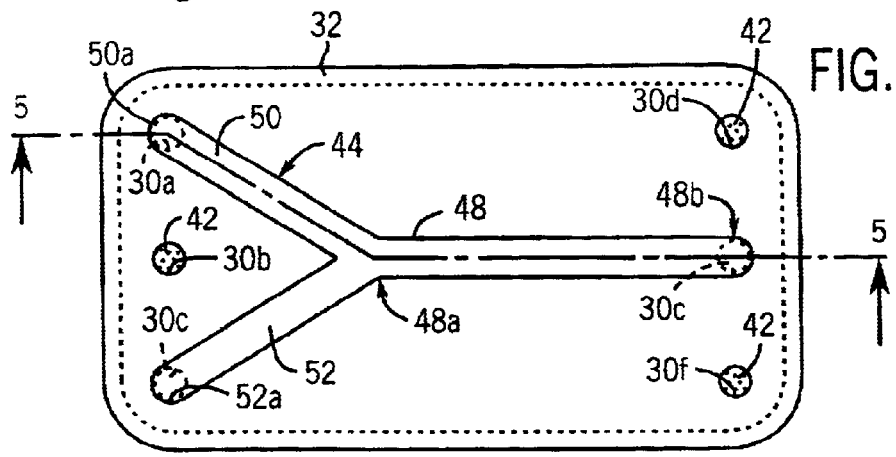

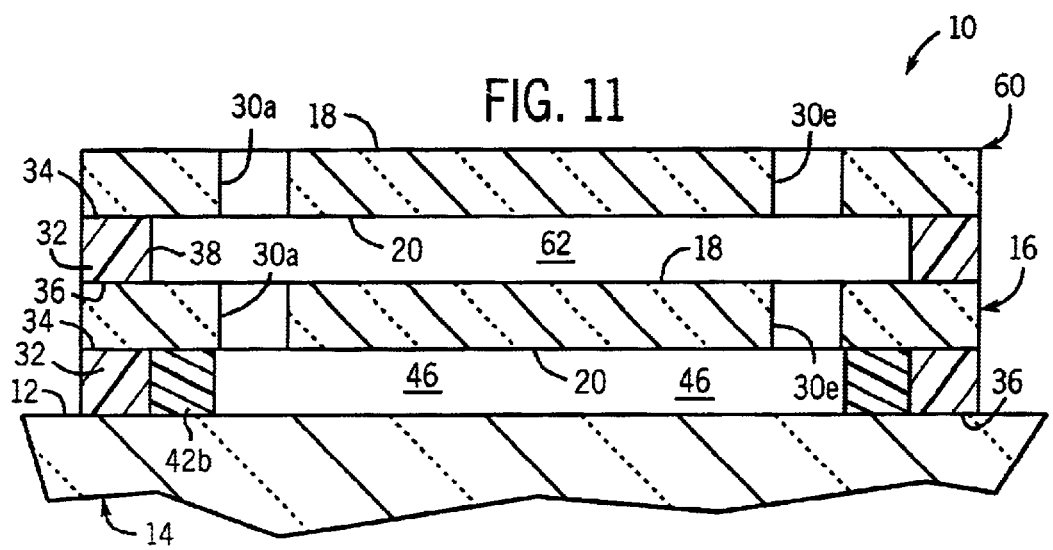
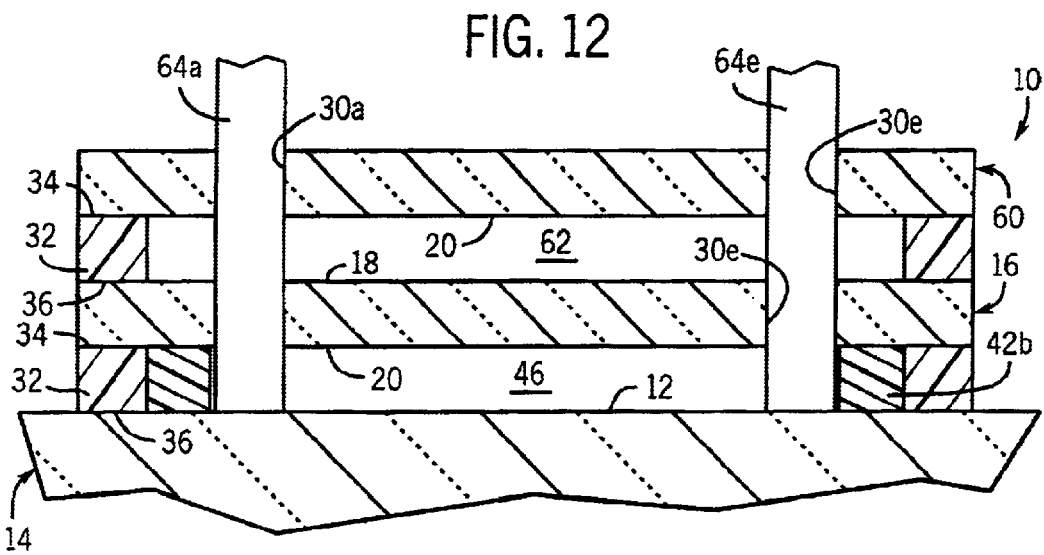
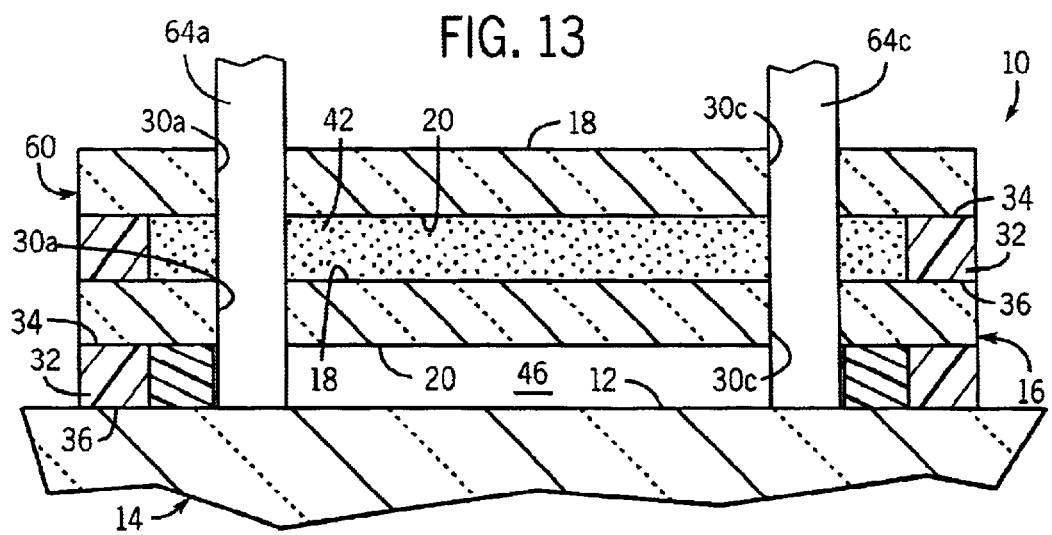

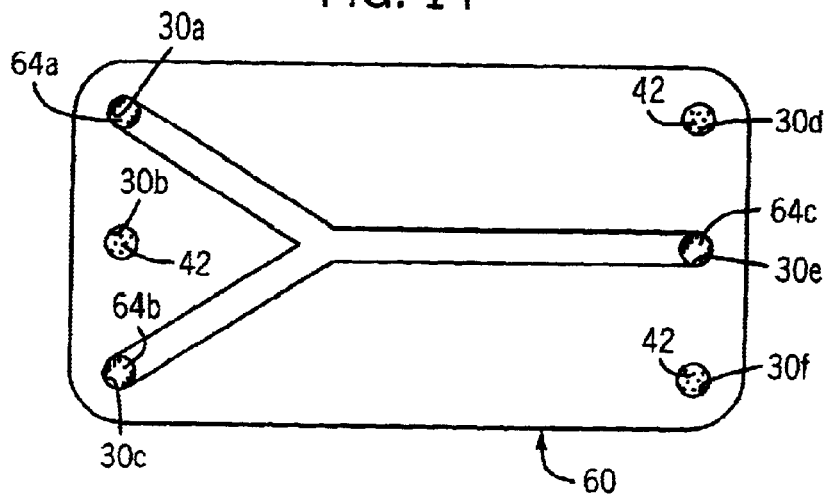
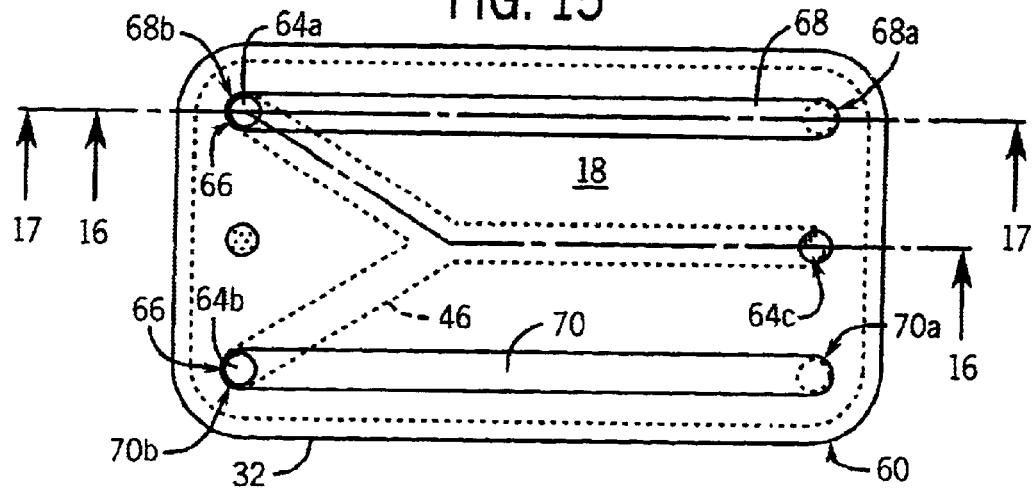
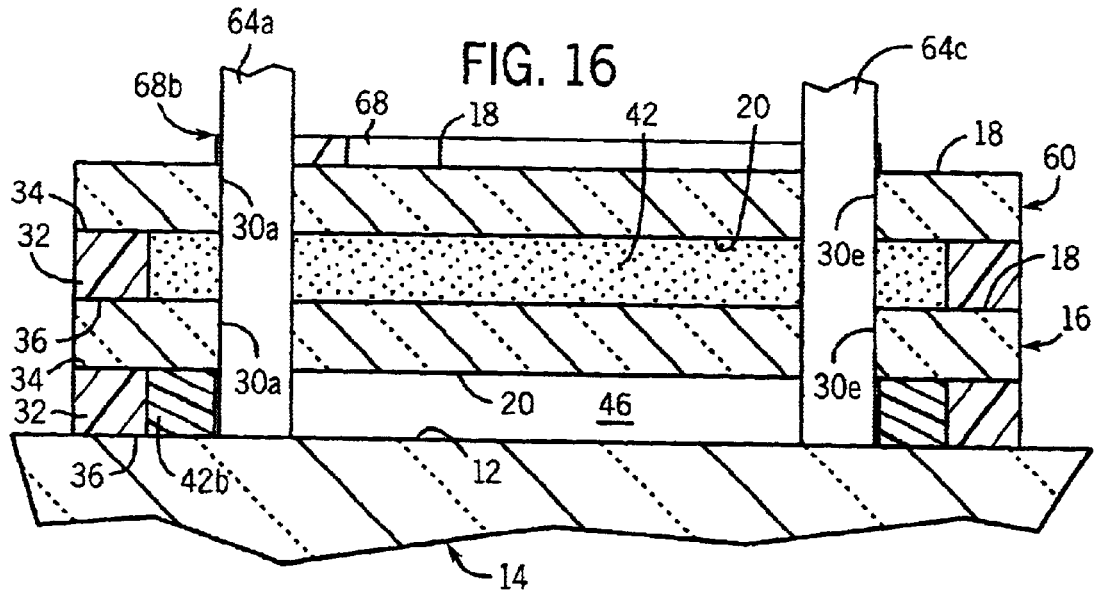

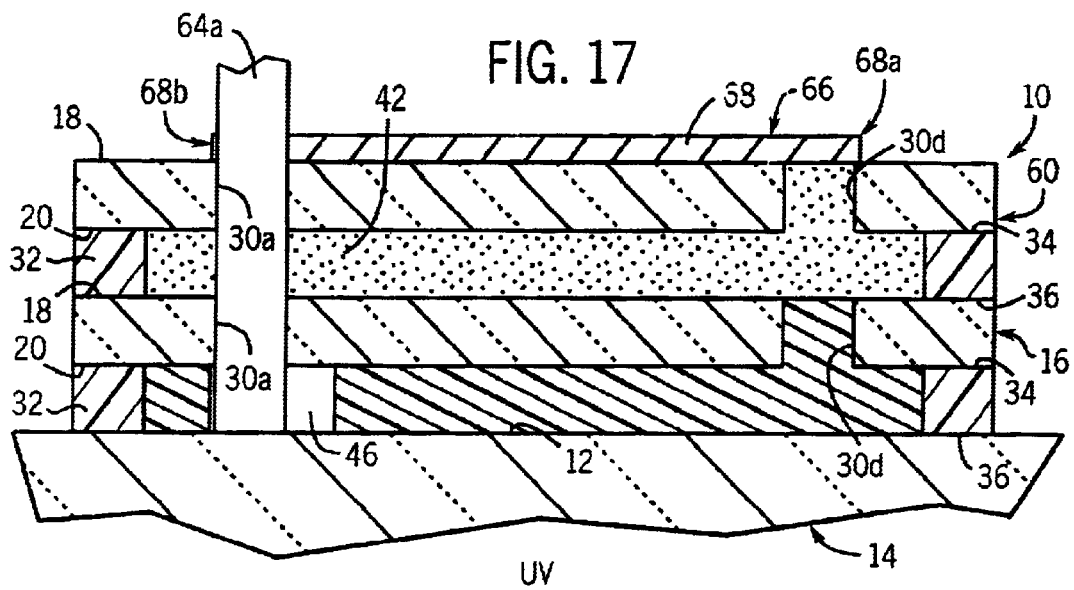
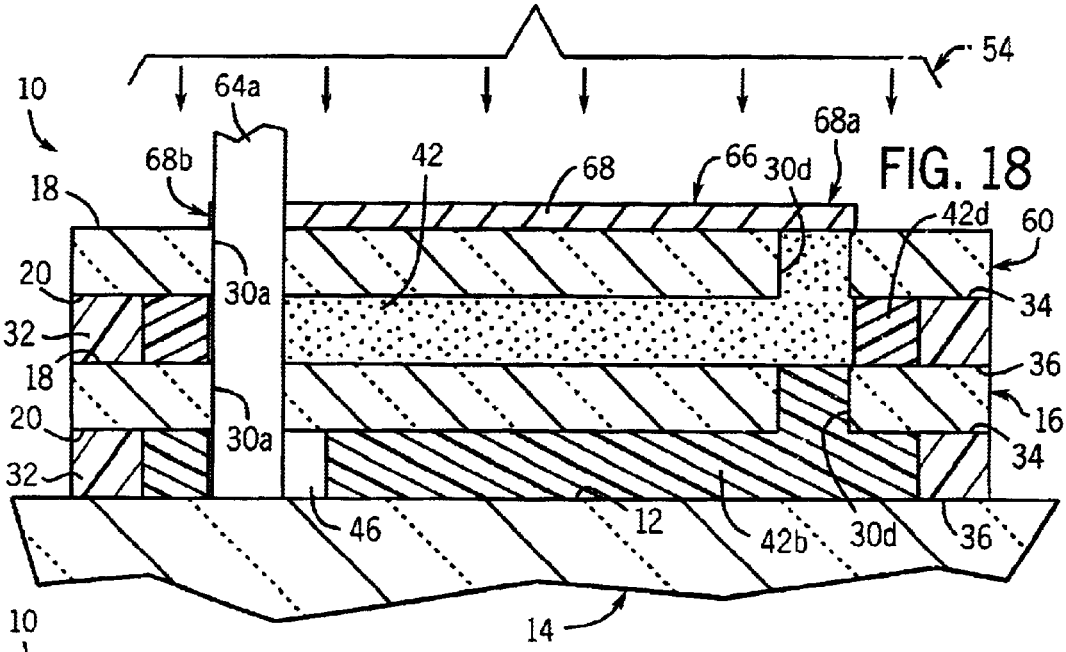
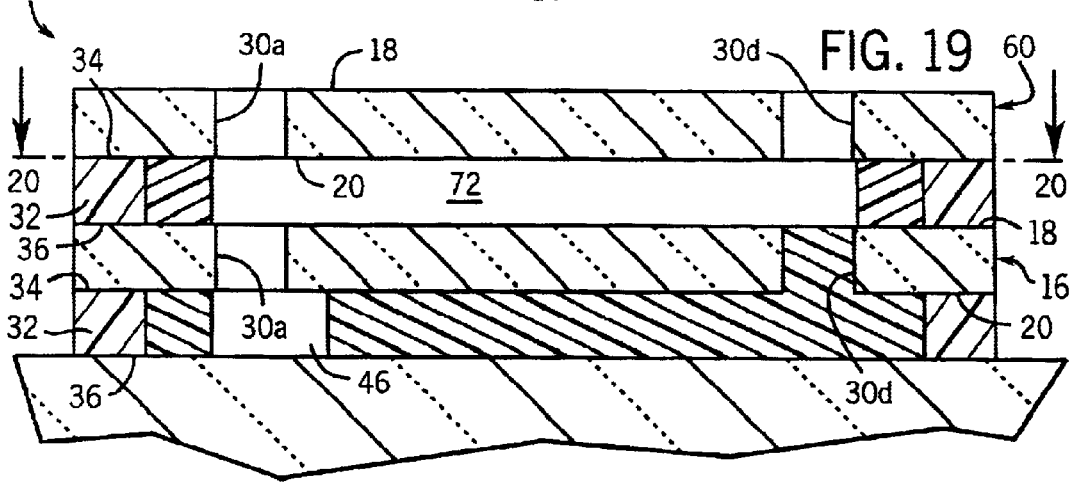

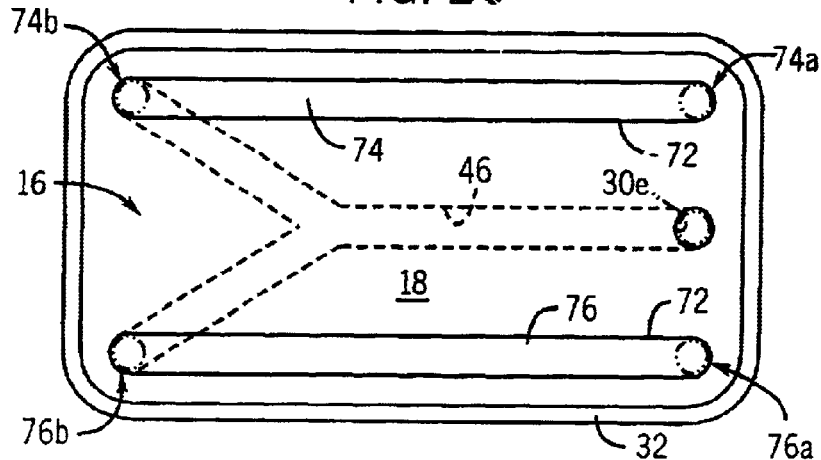
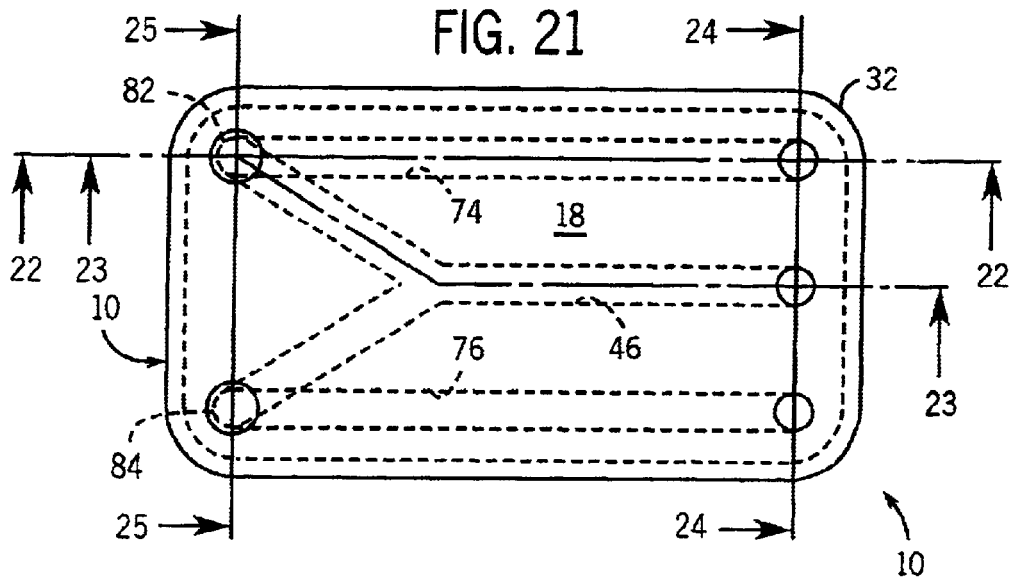
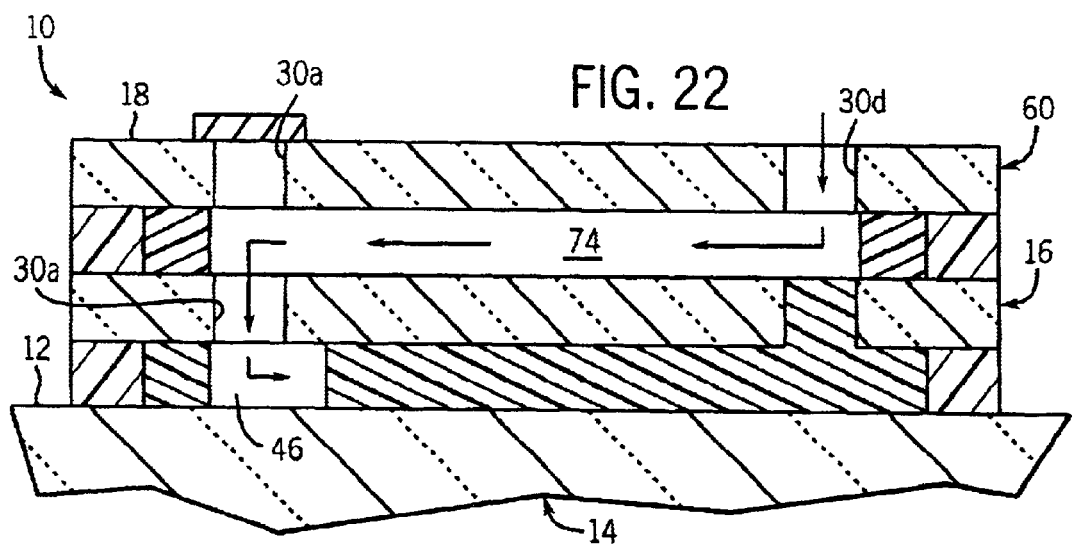

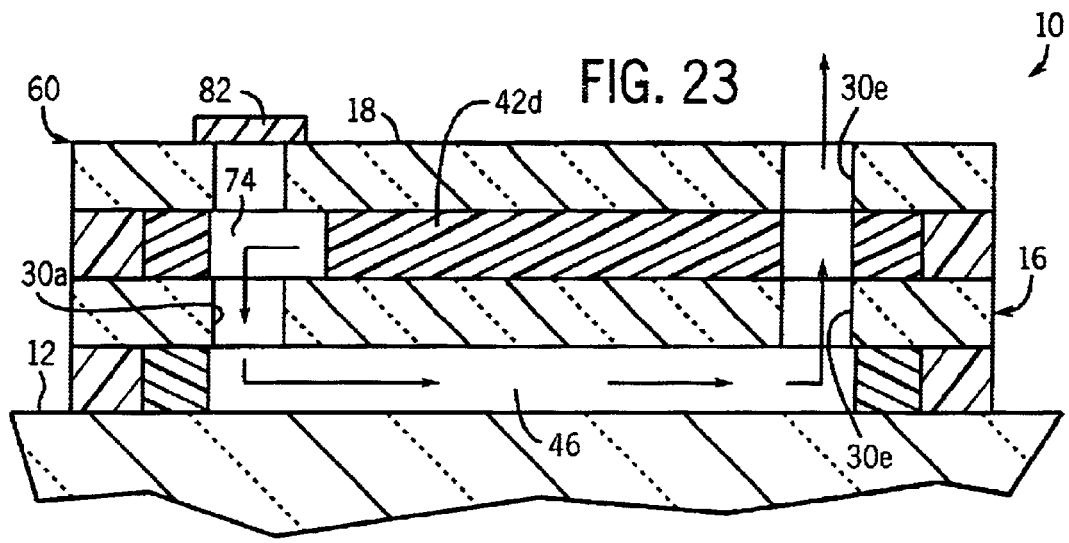
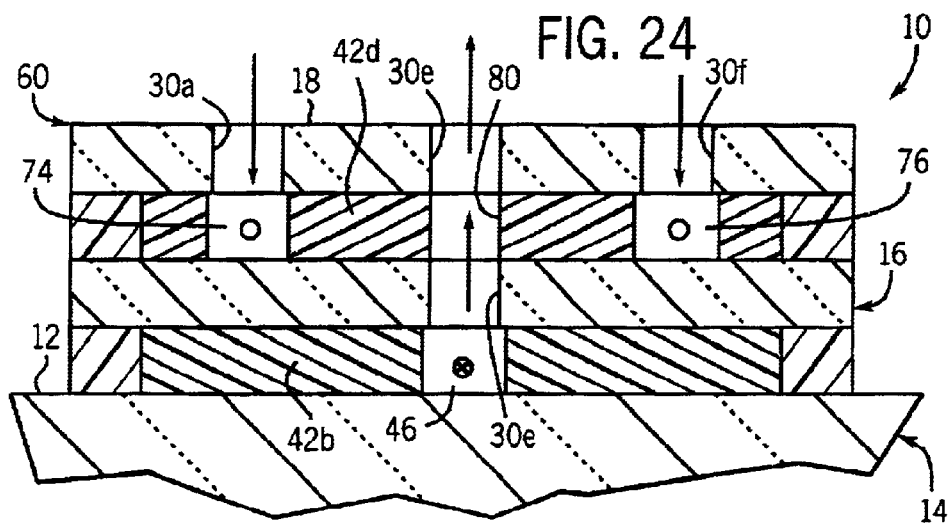
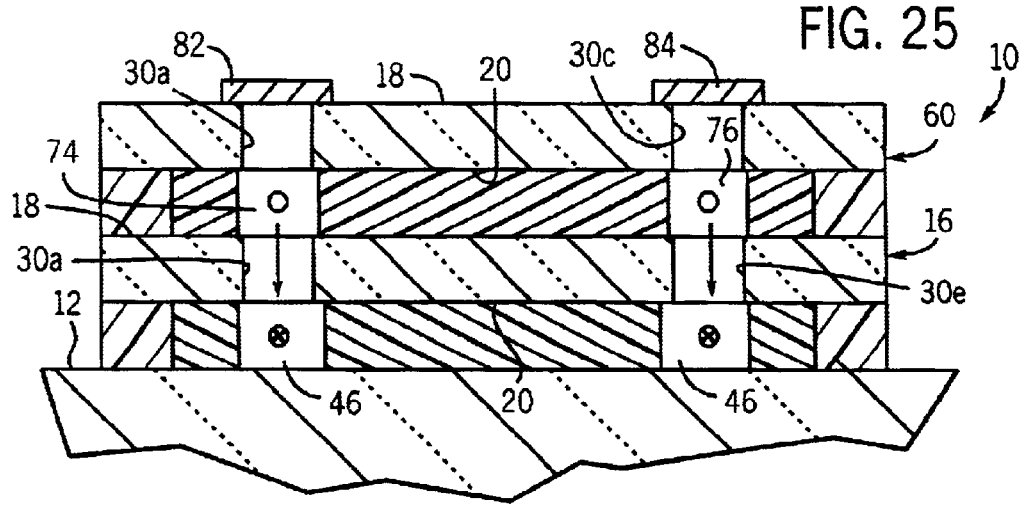

METHOD OF FORMING A MULTI-LAYER MICROFLUIDIC DEVICE

REFERENCE TO GOVERNMENT GRANT

This invention was made with United States government support awarded by the following agencies: DOD ARPA F30602-00-0570. The United States has certain rights in this invention.

FIELD OF THE INVENTION

This invention relates generally to microfluidic devices, and in particular, to a method of forming a multi-layer, microfluidic device using liquid phase, photo-polymerizable materials.

BACKGROUND AND SUMMARY OF THE INVENTION

As is known, microfluidic systems are being used in an increasing number of applications. However, further expansion of the uses for such microfluidic devices has been limited due to the difficulty and expense of fabrication. By way of example, Chow, U.S. Pat. No. 6,167,910 discloses a multi-layer microfluidic device and method of making the same. The microfluidic device disclosed in the Chow '910 patent includes a body structure having a plurality of substrate layers such as a bottom substrate, a middle substrate and a top substrate. The bottom substrate includes a top surface having grooves fabricated therein in any conventional manner, such as by etching or the like. Upon the mating of the top surface of the bottom substrate with the bottom surface of the middle substrate, these grooves form a channel network for the microfluidic device. Additional channel networks may be formed by the top surface of another substrate and the bottom surface of the adjacent substrate. In such manner, multi-layer channel networks may be formed within a microfluidic device. Ports may be provided in each of the substrates to interconnect the various channel networks within the microfluidic device. It is contemplated to thermally bond the substrates together in order to form an integral, microfluidic device.

While the method disclosed in the Chow '910 patent is functional for its intended purpose, the method disclosed therein has significant limitations. By way of example, each of the substrates must be preformed using traditional microfabrication methods that involve etching. These traditional methods are inherently expensive due to the equipment, materials and process complexity issues required. Further, the cost of thermally bonding the substrates together in high temperature annealing ovens increases the overall cost to manufacture the microfluidic device. As such, it is highly desirable to provide a simpler and more economical method of fabricating microfluidic devices.

Therefore, it is a primary object and feature of the present invention to provide a method of fabricating a multi-layer, microfluidic device which is simple and inexpensive.

It is a further object and feature of the present invention to provide a method of fabricating a multi-layer, microfluidic device which has a smaller footprint than prior devices now available.

It is a still further object and feature of the present invention to provide a method of fabricating a multi-layer, microfluidic device which may be customized to a particular application without undue additional expense.

In accordance with the present invention, a method is provided for forming a microfluidic device on a base having an upper surface. The method includes the steps of providing a first layer having upper and lower surfaces and being in a space relationship to the upper surface of the base. The lower surface of the first layer and the upper surface of the base define a construction cavity therebetween. The first layer has a passageway therethrough which communicates with the construction cavity. A mask is positioned between the construction cavity and the source. The mask corresponds to a channel to be formed in the construction cavity. The construction cavity is filled with a material and a portion of the material is polymerized within the construction cavity outside of the channel with the source such that the portion of the material is solidified. The material within the channel is flushed therefrom.

The first layer may include a fill hole therethrough for allowing for the filling of the construction cavity. In addition, the passageway communicates with the channel. The passageway may be plugged to prevent material from flowing therein during filling. It is contemplated to provide a gasket about the construction cavity to maintain the material therein during filling. The step of positioning the mask includes the additional step of affixing the mask to the upper surface of the first layer.

A second layer may be provided having upper and lower surfaces and being in a spaced relationship to the first layer such that the lower surface of the second layer and the upper surface of the first layer define a second construction cavity therebetween. The second layer has a passageway therethrough which communicates with the second construction cavity. A second mask is positioned between a second construction cavity and the source. The second mask corresponds to a channel to be formed in the second construction cavity. The second construction cavity is filled with material. A portion of the material is polymerized within the second construction cavity outside of the channel with the source such that the portion of the material is solidified. The material is flushed from the channel in the second construction cavity.

The passageway through the second layer and the passageway through the first layer are axially aligned and communicate with each other through the channel in the second construction cavity. The passageways in the first and second layers may be plugged to prevent the material from flowing therein during the step of filling the second construction cavity with material. Thereafter, the passageways in the first and second layers are cleared after a portion of the material is polymerized within the second construction cavity such that the channel in the first construction cavity and the channel in the second construction cavity communicate through the passageway in the first layer. The passageway through the second layer communicates with the upper surface of the second layer through an opening. The method of the present invention may include the additional steps of covering the opening and removing the mask between the construction cavity and the source prior to providing the second layer.

It is contemplated that the passageway in the first layer communicate with the channel in the construction cavity and with the channel in the second construction cavity. The first layer includes a second passageway therethrough that communicates with the channel in the construction cavity. The passageway in the second layer communicates with the channel in the second construction cavity and with the upper surface of the second layer through a first opening. The second layer includes a second passageway therethrough that communicates with the second passageway through the first layer and with the upper surface of the second layer through a second opening. One of the openings in the second layer comprises an input and the other of the openings comprises an output to the microfluidic device.

In accordance with the still further aspect of the present invention, a method is provided for forming a microfluidic device on a base having an upper surface. The method includes the steps of providing a first layer having upper and lower surfaces and being in space relationship to the upper surface of the base. The lower surface of the first layer and the upper surface of the base to define a construction cavity therebetween. The construction cavity is filled with a material and a portion of the material is polymerized within the construction cavity so as to solidify the same. The solidified material defines a first channel. The non-polymerized material is flushed thereafter from the channel.

In order to polymerize a portion of the material, a mask is positioned between the construction cavity and a source. The mask corresponds to the shape of the first channel formed in a construction cavity. Ultraviolet radiation is generated with the source and directed towards the mask.

It is contemplated to provide a second layer having upper and lower surfaces. The second layer is spaced from the first layer such that the lower surface of the second layer and the upper surface of the first layer define a second construction cavity therebetween. The second construction cavity is filled with some material and a portion of the material is polymerized so as to solidify the same. The solidified material defines a second channel in the microfluidic device. A first passageway is provided through the first layer which communicates with the first and second channels. A second passageway is provided through the first layer which communicates with the first channel. A first passageway is provided in the second layer which communicates with the second channel and with the upper surface of the second layer through a first opening. In addition, second passageway is provided through the second layer which communicates with the second passageway through the first layer and with the upper surface of the second layer through a second opening. One of the openings in the second layer comprises as an input and the other of the openings comprises an output to the microfluidic device.

In accordance with a further aspect of the present invention, a method is provided for forming a microfluidic device on a base having an upper surface. The method includes the step of providing a first layer having upper and lower surfaces and being in a space relationship to the upper surface of the base such that the lower surface of the first layer and the upper surface of the base define a construction cavity therebetween. The first layer has a first and second passageways and a fill hole therethrough which communicates with the construction cavity. A mask is affixed to the upper surface of the first layer corresponding to a channel network to be formed in the construction cavity. A material is injected into the construction cavity through the fill hole in the first layer. A portion of the material is polymerized within the construction cavity so as to solidify the same. The solidified material defines the channel network that communicates within the first and second passageways through the first layer. The material within the channel network is flushed therefrom and the mask is removed from the upper surface of the first layer. A second layer having upper and lower surfaces is also provided. The second layer is positioned on the first layer such that the lower surface of the second layer and the upper surface of the first layer define a second construction cavity therebetween. The second layer has first and second passageways and a fill hole therethrough which communicate with the second construction cavity.

The first and second passageways in the first layer are plugged and a mask is affixed to the upper surface of the second layer. The mask corresponds to a second channel network to be formed in the second construction cavity. A material is injected into the second construction cavity through the fill hole in the second layer. A portion of the material is polymerized within the second construction cavity so as to solidify the same. The solidified material in the second construction cavity defines the second channel network that communicates with the first passageway through the second layer. The material within the second channel network is flushed therefrom. The first and second passageways in the first layer are unplugged such that the first passageway through the first layer communicates with the second channel network and the second passageway through the first layer communicates with the second passageway through the second layer. Thereafter, the mask is removed from the upper surface of the second layer.

It is contemplated to position a first gasket about the construction cavity to maintain the material therein during the filling thereof. A second gasket may be positioned about the second construction cavity to maintain the material therein during the filling thereof. The first passageway through the second layer communicates with the upper surface of the second layer through a first opening and the second passageway through the second layer communicates with the upper surface of the second layer through a second opening. One of the openings in the second layer is provided as an input and the other of the openings in the second layer is provided as an output to the microfluidic device.

BRIEF DESCRIPTION OF THE DRAWINGS

The drawings furnished herewith illustrate a preferred methodology of the present invention in which the above advantages and features are clearly disclosed as well as others which will be readily understood from the following description of the illustrated embodiment.

In the drawings:

FIG. 1 is a top plan view of a first layer of a microfluidic device to be constructed in accordance with the present invention;

FIG. 2 is a cross-sectional view of the first layer of the microfluidic device taken along line 2—2 of FIG. 1;

FIG. 3 is a cross-sectional view similar to FIG. 2, showing a cavity defined by the first layer of the microfluidic device filled with a polymerizable material;

FIG. 4 is a top plan view of the first layer of the microfluidic device with a optical mask positioned thereon;

FIG. 11 is a cross-sectional view of the microfluidic device taken along line 11—11 of FIG. 10;

FIG. 12 is a cross-sectional view of the microfluidic device, similar to FIG. 11, showing plugs positioned within user selected openings in the microfluidic device;

FIG. 13 is a cross-sectional view of a microfluidic device of the present invention, similar to FIG. 12, showing a cavity, defined by a second layer of the microfluidic device filled with polymerizable material;

FIG. 14 is a top plan view of the microfluidic device of FIG. 13;

FIG. 15 is a top plan view of the microfluidic device having an optical mask affixed to the upper surface of the second layer thereof;

FIG. 16 is a cross-sectional view of the microfluidic device taken along line 16—16 of FIG. 15;

FIG. 17 is a cross-sectional view of the microfluidic device taken along line 17—17 of FIG. 15;

FIG. 18 is a cross-sectional view of the microfluidic device similar to FIG. 17, showing polymerization of the microfluidic device with UV light;

FIG. 19 is a cross-sectional view of the microfluidic device similar to FIG. 18, showing the non-polymerized material flushed from the channel network defined by the second layer thereof;

FIG. 20 is a cross-sectional view of the microfluidic device taken along line 20—20 of FIG. 19;

FIG. 21 is a top plan view of the microfluidic device;

FIG. 22 is a cross-sectional view of the microfluidic device taken along line 22—22 of FIG. 21;

FIG. 23 is a cross-sectional view of the microfluidic device taken along line 23—23 of FIG. 21;

FIG. 24 is a cross-sectional view of the microfluidic device taken along line 24—24 of FIG. 21; and FIG. 25 is a cross-sectional view of the microfluidic device taken along line 25—25 of FIG. 21.

DETAILED DESCRIPTION OF THE DRAWINGS

Figure 5:
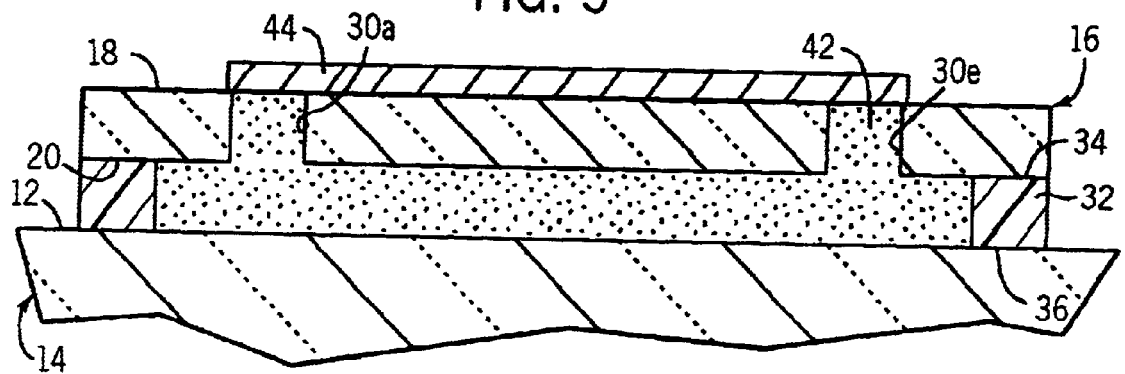
FIG. 5 is a cross-sectional view of the first layer of the microfluidic device taken along line 5—5 of FIG. 4.

Referring to FIGS. 22–25, a microfluidic device constructed in accordance with the methodology of the present invention is generally designated by the reference numeral 10. It is intended that microfluidic device 10 include a plurality of layers, each of which incorporating a corresponding channel network, as hereinafter described. Referring to FIGS. 1–2, microfluidic device 10 includes a first layer 16 positioned on upper surface 12 of microscope slide 14. In addition to being positionable on microscope slide 14, first layer 16 may be positioned on any substrate, such as a silicon wafer or print circuited board, without deviating from the scope of the present invention in order to allow microfluidic device 10 to be operatively connected to such substrate if so desired by the user. First layer 16 is formed from a polymeric material and includes upper and lower surfaces 18 and 20, respectively, interconnected by first and second ends 22 and 24, respectively, and first and second sides 26 and 28, respectively. A plurality of holes 30a–30f extend through first layer 16 and communicate with upper and lower surfaces 18 and 20, respectively, thereof.

Gasket 32 includes an upper surface 34 affixed to lower surface 20 of first layer 16 adjacent the outer periphery thereof. Lower surface 36 of gasket 32 is affixed to upper surface 12 of microscope slide 14. As assembled, inner surface 38 of gasket 32, lower surface 20 of first layer 16 and upper surface 12 of microscope slide 14 define a cavity 40 for receiving polymerizable material 42 therein, FIG. 3. The material is injected into cavity 40 through any one of the openings 30a–30f through the first layer 16.

Referring to FIGS. 4–8, optical mask 44 is affixed to upper surface 18 of first layer 16. It is intended that optical mask 44 correspond to the shape of a channel network 46 to be formed in cavity 40, FIG. 9, as hereinafter described. By way of example, optical mask 44 is generally Y-shaped and includes a base portion 48 having first and second legs 50 and 52, respectively, diverging from first end 48a thereof. Terminal ends 50a, 52a and 48b of optical mask 44 overlap corresponding openings 30a, 30c, and 30e, respectively, in first layer 16 in order for such opening to remain open after polymerization of material 42, as hereinafter described.

Figure 6:
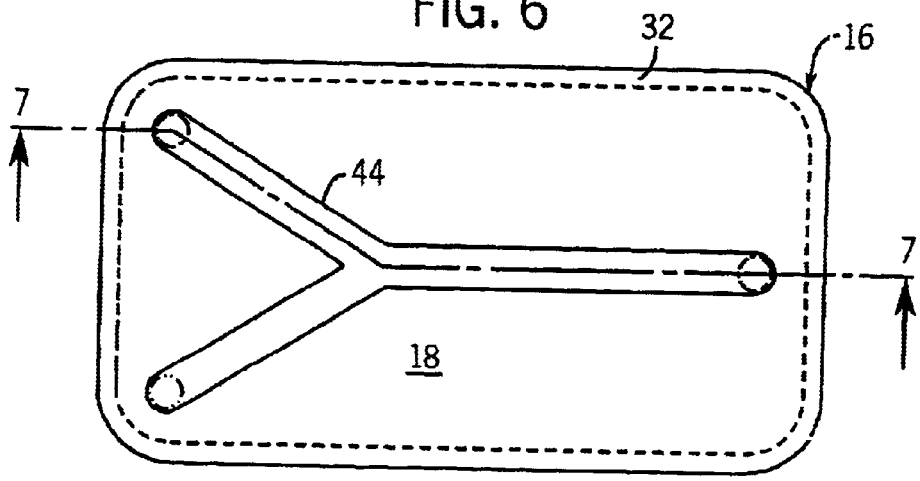
FIG. 6 is a top plan view of the first layer of the microfluidic device after the polymerization thereof.
Figure 7:
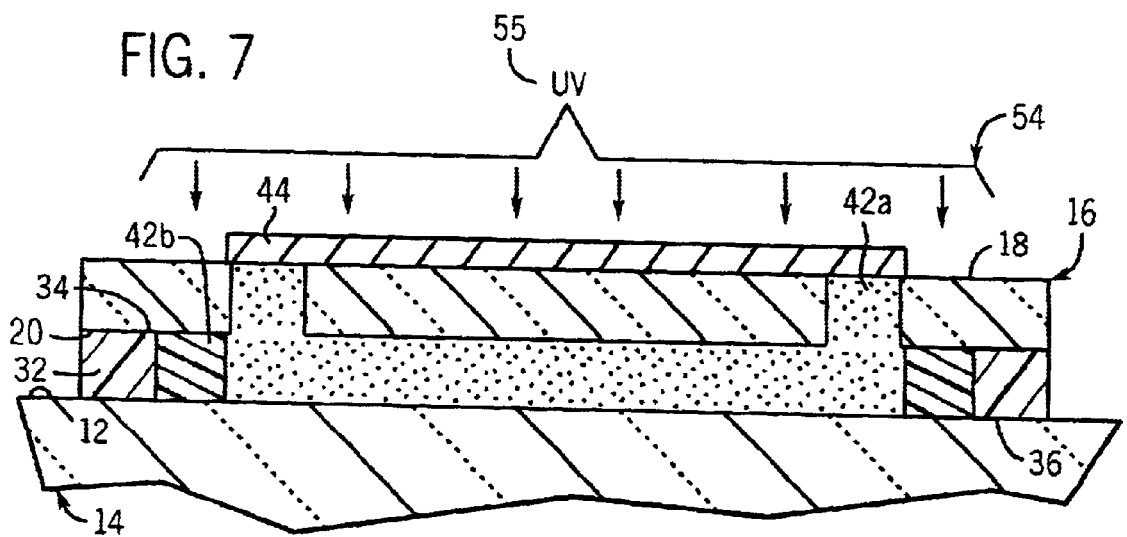
FIG. 7 is a cross-sectional view of the first layer of the microfluidic device taken along line 7—7 of FIG. 6.

Referring to FIGS. 6 and 7, ultraviolet light generally designated by the reference numbers 54 is generated by a UV source 55, and is directed towards microfluidic device 10 at an angle generally perpendicular to upper surface 18 of first layer 16. As is known, the polymerizable material 42 polymerizes and solidifies when exposed to ultraviolet light 54. It can be appreciated that optical mask 44 shields a first portion 42a of the polymerizable material 42 from ultraviolet light 54. As a result, second portion 42b of material 42, which is exposed to ultraviolet light 54, polymerizes and solidifies. On the other hand, first portion 42a of material 42, which is not exposed to ultraviolet light 54, does not polymerize and remains in a fluidic state.

Figure 8:
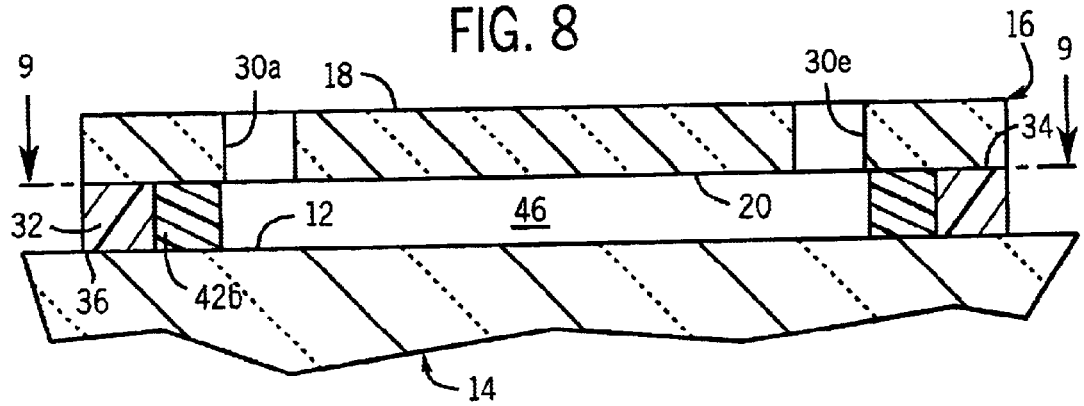
FIG. 8 is a cross-sectional view of the first layer of the microfluidic device after flushing of the polymerizable material from the channel network thereof.
Figure 9:
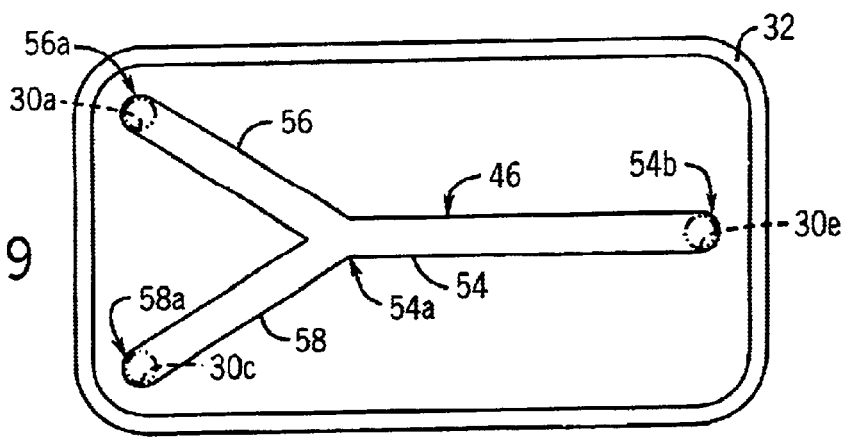
FIG. 9 is a cross-sectional view of the first layer of the microfluidic device taken along line 9—9 of FIG. 8.

Referring to FIGS. 8 and 9, after polymerization of second portion 42b of material 42 by ultraviolet light 54, optical mask 44 is removed from upper surface 18. In addition, the non-polymerized portion 42a of the material is flushed from channel network 46 and openings 30a, 30c and 30e in first layer 16. It can be appreciated that channel network 46 has a generally Y-shape that corresponds to the shape of optical mask 44. Channel network 46 includes a base 54 having first and second legs 56 and 58 diverging from a first end 54a thereof. Terminal end 56a of leg 56 of channel network 46 communicates with opening 30a through first layer 16. Terminal end 58a of leg 58 of channel network 46 communicates with opening 30c through first layer 16. Terminal end 54b of base 54 of channel network 46 communicates with opening 30e through first layer 16.

Figure 10:
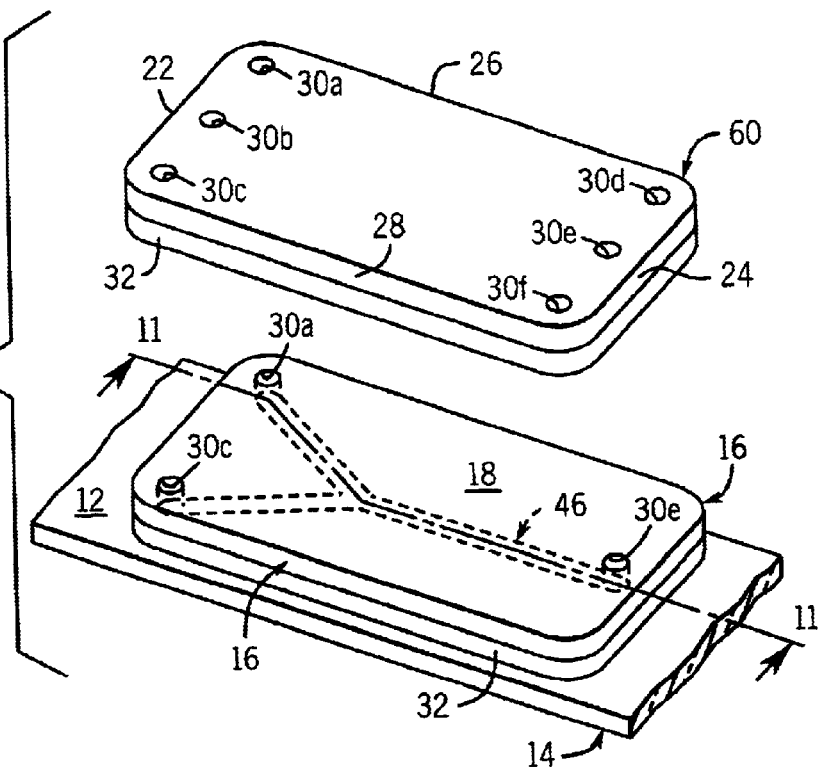
FIG. 10 is an expanded, isometric view showing assembly of the microfluidic device.

Referring to FIG. 10, in order to form a multi-layer microfluidic device, second layer 60 is positioned on upper surface 18 of first layer 16. It can be appreciated that second layer 60 is identical in structure to first layer 16, and as such, the previous description of first layer 16 is understood to describe second layer 60 as if fully described herein. In order to facilitate understanding, common reference characters are used hereinafter to refer to the components of first layer 16 and second layer 60.

Referring to FIGS. 11–14, second layer 60 is positioned on first layer 16 such that inner surface 38 of gasket 32 of second layer 60, lower surface 20 of second layer 60 and upper surface 18 of first layer 16 define a cavity 62 for receiving additional polymerizable material 42, as hereinafter described. In addition, second layer 60 is positioned on upper surface 18 of first layer 16 such that openings 30a, 30c and 30e through second layer 60 are aligned with corresponding openings 30a, 30c, and 30e, respectively, through first layer 16.

In order to insure communication between channel network 46 and the environment outside microfluidic device 10, a plurality of plugs 64a–c are inserted into microfluidic device 10. Plugs 64a–c may take the form of physical plugs, immiscible fluid, dissoluble solid or any other appropriate material. Plug 64a is inserted through opening 30a in second layer 60, cavity 62, opening 30a in first layer 16 and into channel network 46. Plug 64b is inserted through opening 30c in second layer 60, cavity 62, opening 30c through first layer 16 and into channel network 46. Plug 64c is inserted through opening 30e in second layer 60, cavity 62, opening 30e in first layer 16 and into channel network 46. Thereafter, polymerizable material 42 is injected into cavity 62 through one or more of openings 30b, 30d and 30f through second layer 60, FIG. 13. It can be appreciated that plugs 64a, 64b and 64c isolate channel network 46 and prevent material 42 from flowing therein.

Referring to FIGS. 15–18, second optical mask 66 is affixed to upper surface 18 of second layer 60. By way of example, second optical mask 66 includes a first masking portion 68 having a first end 68a which overlaps opening 30d through second layer 60 and a second end 68b which extends about the outer periphery of plug 64a. In addition, second optical mask 66 includes a second masking portion 70 having a first end 70a overlapping opening 30f through second layer 60 and a second end 70d which extends about plug 64b. It is intended that second optical mask 66 correspond to the configuration of a second channel network 72, FIG. 20, to be formed in a microfluidic device 10.

After second optical mask 66 is affixed to upper surface 18 of second layer 60, ultraviolet light 54 is directed towards microfluidic device 10 at an angle generally perpendicular to upper surface 18 of second layer 60. It can be appreciated that upper mask 66 shields a first portion 42c of material 42 within cavity 62 from ultraviolet light 54. Consequently, ultraviolet light 54 polymerizes and solidifies only second portion 42d of material 42 within cavity 62 which is not overlapped by second optical mask 66. Portion 42c of material 42 in cavity 62 which is overlapped by a second optical mask 66 is not polymerized, and as such, remains fluidic. Thereafter, as best seen in FIG. 19, second optical mask 66 is removed from upper surface 18 of second layer 60 and the non-polymerized portion 42c of material 42 is flushed from second channel network 72 formed in microfluidic device 10. In addition, plugs 64a–c are removed from microfluidic device 10.

Referring to FIGS. 20 and 21, second channel network 72 includes first and second generally parallel channels 74 and 76, respectively. First channel 74 of second channel network 72 has a first end 74a which communicates with opening 30d in second layer 60 such that opening 30d through second layer 60 defines a first input to microfluidic device 10, FIG. 24. Second end 70b of first channel 74 of second channel network 72 communicates with first channel network 46 through opening 30a in first layer 16. In addition, first channel 74 communicates with upper surface 18 of second layer 60 through opening 30a in second layer 60, FIG. 22.

First end 76a of second channel 76 of second channel network 72 communicates with opening 30f through second layer 60 such that opening 30f defines a second input to microfluidic device 10, FIG. 24. Second end 76b of second channel 76 of second channel network 72 communicates with first channel network 46 through opening 30c through first layer 16, FIG. 25. In addition, second end 76b of second channel 76 of second channel network 72 communicates with upper surface 18 of second layer 60 through opening 30c in second layer 60, FIG. 25.

Referring to FIGS. 23 and 24, first channel network 46 also communicates with upper surface 18 of second layer 60 through opening 30e through: first layer 16; a passageway 80 through polymerized portion 42d of material 42 within cavity 62 formed by the presence of plug 64c extending through cavities 62 during polymerization; and cavity 30e through second layer 60 such that opening 30e through second layer 60 corresponds to an output for microfluidic device 10. It is contemplated to provide caps 82 and 84 on upper surface 18 of second layer 60 to close openings 30a and 30c in second layer 60 so as to isolate first and second channel networks 46 and 72, respectively, from the environment external of microfluidic device 10.

As described, a sample fluid under pressure may be provided at inputs 30d and 30e of second layer 60 of microfluidic device 10. The sample fluid will flow through channels 74 and 76 of second channel network 72 and into first channel network 46 through corresponding openings 30a and 30c, respectively, in first layer 16. The sample fluid flow will continue to through channel network 16 and out of microfluidic device 10 through output 30e through second layer 60.

It can be appreciated that channel networks having different configurations may be fabricated within microfluidic device 10 using the method heretofore described by simply varying the configurations of optical masks 44 and 68. In addition, it is contemplated as being within the scope of the present invention to provide microfluidic device 10 with additional layers and to form additional channel networks using the methodology heretofore described. No limit as to the number of layers is contemplated. In such microfluidic devices having three more layers, it can be appreciate that the channel networks formed by adjacent layers do not necessarily have to be in communication with each other.

Various modes of carrying out the invention are contemplated as being within the scope of the following claims particularly pointing out and distinctly claiming the subject matter which is regarded as the invention.

We claim:

1. A method of forming a microfluidic device on a base having an upper surface, comprising the steps of:

providing a first layer having upper and lower surfaces and being in a spaced relationship to the upper surface of the base such that the lower surface of the first layer and the upper surface of the base define a first construction cavity therebetween, the first layer has passageway therethrough which communicates with the first construction cavity;

positioning a mask between the first construction cavity and a source, the mask corresponding to a first channel to be formed in the first construction cavity;

filling the first construction cavity with a material;

polymerizing a portion of the material within the first construction cavity outside the first channel with the source such that the portion of the material is solidified;

flushing the material from the first channel;

providing a second layer having upper and lower surfaces and being in a spaced relationship to the first layer such that the lower surface of the second layer and the upper surface of the first layer define a second construction cavity, therebetween, the second layer having a passageway therethrough which communicates with the second construction cavity;

positioning a second mask between the second construction cavity and the source, the second mask corresponding to a second channel to be formed in the second construction cavity;

filling the second construction cavity with the material;

polymerizing a portion of the material within the second construction cavity outside the second channel with the source such that the portion of the material is solidified; and flushing the material from the second channel in the second construction cavity, and interconnecting the second channel with the first channel.

2. The method of claim 1 wherein the first layer includes a fill hole therethough for allowing for the filling of the first construction cavity therethrough.

3. The method of claim 1 wherein the first layer has a passageway therethrough which communicates with the first construction cavity and wherein the passageway communicates with the first channel in the construction cavity and wherein the method further comprises the additional step of plugging the passageway in the first layer to prevent the material from flowing therein during filling.

4. The method of claim 1 further comprising the additional step of positioning a gasket about the first construction cavity to maintain the material therein during filling.

5. The method of claim 1 wherein the step of positioning the mask includes the step of affixing the mask to the upper surface of the first layer.

6. The method of claim 1 wherein:

the first layer has a passageway therethrough which communicates with the construction cavity;

the second layer has a passageway therethrough which communicates with the second construction cavity; and the passageway through the second layer and the passageway through the first layer are axially aligned and communicate with each other through the second channel in the second construction cavity.

7. The method of claim 6 comprising the additional steps of:

plugging the passageways in the first and second layers to prevent the material from flowing therein during the step of filling of the second construction cavity with the material; and clearing the passageways in the first and second layers after the step of polymerizing a portion of the material within the second construction cavity such that the first channel in the first construction cavity and the second channel in the second construction cavity communicate through the passageway in the first layer.

8. The method of claim 7 wherein the passageway through the second layer communicates with the upper surface of the second layer through an opening and wherein the method further comprises the additional step of covering the opening.

9. The method of claim 1 comprising the additional step of removing the mask between the first construction cavity and the source prior to providing the second layer.

10. The method of claim 1 wherein:

the first layer has a passageway therethrough which communicates with the first construction cavity, the passageway in the first layer communicates with the first channel in the first construction cavity and with the second channel in the second construction cavity;

the first layer includes a second passageway therethrough that communicates with the first channel in the first construction cavity;

the passageway in the second layer communicates with the second channel in the second construction cavity and with the upper surface of the second layer through a first opening; and the second layer includes a second passageway therethrough that communicates with the second passageway through the first layer and with the upper surface of the second layer through a second opening, such that one of the openings in the second layer comprises an input and the other of the openings comprises an output.

11. A method of forming a microfluidic device on a base having an upper surface, comprising the steps of:

providing a first layer having upper and lower surfaces and being in a spaced relationship to the upper surface of the base such that the lower surface of the first layer and the upper surface of the base define a first construction cavity therebetween;

filling the first construction cavity with a material;

polymerizing a portion of the material within the first construction cavity so as to solidify the same, the solidified material defining a first channel;

providing a second layer having upper and lower surfaces and being in a spaced relationship to the first layer such that the lower surface of the second layer and the upper surface of the first layer define a second construction cavity therebetween;

filling the second construction cavity with the material;

polymerizing a portion of the material within the second construction cavity so as to solidify the same, the solidified material defining a second channel; and interconnecting the first and second channels.

12. The method of claim 11 comprising the additional step of flushing the material from the first channel.

13. The method of claim 11 wherein the step of polymerizing a portion of the material includes the steps of:

positioning a mask between the first construction cavity and a source, the mask corresponding to the first channel formed in the first construction cavity; and generating ultraviolet radiation with the source.

14. The method of claim 11 comprising the additional steps:

providing a first passageway through the first layer, the first passageway communicating with the first and second channels;

providing a second passageway through the first layer, the second passageway communicating with the first channel, providing a first passageway through the second layer, the first passageway through the second layer communicating with the second channel and with the upper surface of the second layer through a first opening; and providing a second passageway through the second layer, the second passageway through the second layer communicating with the second passageway through the first layer and with the upper surface of the second layer through a second opening.

15. The method of claim 14 wherein one of the openings in the second layer comprises an input and the other of the openings comprises an output.

16. A method of forming a microfluidic device on a base having an upper surface, comprising the steps of:

providing a first layer having upper and lower surfaces and being in a spaced relationship to the upper surface of the base such that the lower surface of the first layer and the upper surface of the base define a construction cavity therebetween, the first layer having first and second passageways and a fill hole therethrough which communicate with the construction cavity;

affixing a mask to the upper surface of the first layer corresponding to a channel network to be formed in the construction cavity;

injecting a material into the construction cavity through the fill hole in the first layer;

polymerizing a portion of the material within the construction cavity so as to solidify the same, the solidified material defining the channel network that communicates with the first and second passageways through the first layer;

flushing the material from the channel network;

removing the mask from the upper surface of the first layer;

providing a second layer having upper and lower surfaces and being in a spaced relationship to the upper surface of the first layer such that the lower surface of the second layer and the upper surface of the first layer define a second construction cavity therebetween, the second layer having first and second passageways and a fill hole therethrough which communicate with the second construction cavity;

plugging the first and second passageways in the first layer;

affixing a mask to the upper surface of the second layer corresponding to a second channel network to be formed in the second construction cavity;

injecting a material into the second construction cavity through the fill hole in the second layer;

polymerizing a portion of the material within the second construction cavity so as to solidify the same, the solidified material in the second construction cavity defining the second channel network that communicates with the first passageway through the second layer;

flushing the material from the second channel network;

unplugging the first and second passageways in the first layer such that the first passageway through the first layer communicates with the second channel network and the second passageway in the first layer communicates with the second passageway through the second layer; and removing the mask from the upper surface of the second layer.

17. The method of claim 16 further comprising the additional steps of:

positioning a first gasket about the construction cavity to maintain the material therein during the filling thereof; and positioning a second gasket about the second construction cavity to maintain the material therein during the filling thereof.

18. The method of claim 16 wherein:

the first passageway through the second layer communicates the upper surface of the second layer through a first opening;

the second passageway through the second layer communicates the upper surface of the second layer through a second opening; and wherein the method comprises the additional step of:

providing one of the openings in the second layer as an input and the other of the openings in the second layer as an output.

* * * * *